United States Patent
Oba

(10) Patent No.: US 8,279,672 B2
(45) Date of Patent: Oct. 2, 2012

(54) NONVOLATILE MEMORY HAVING PLURALITY OF MEMORY BLOCKS EACH INCLUDING DATA STORAGE AREA AND DISCRIMINATION AREA

(75) Inventor: Kaori Oba, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 269 days.

(21) Appl. No.: 12/656,177

(22) Filed: Jan. 20, 2010

(65) Prior Publication Data

US 2010/0182836 A1    Jul. 22, 2010

(30) Foreign Application Priority Data

Jan. 21, 2009   (JP) ................... 2009-010475

(51) Int. Cl.
    *G11C 11/34*      (2006.01)

(52) U.S. Cl. ................................. 365/185.11

(58) Field of Classification Search .............. 365/185.11
See application file for complete search history.

(56) References Cited

U.S. PATENT DOCUMENTS

| | | | | |
|---|---|---|---|---|
| 5,963,489 A | * | 10/1999 | Kirihata et al. | 365/200 |
| 6,598,114 B2 | * | 7/2003 | Funakoshi | 711/103 |
| 2004/0208061 A1 | * | 10/2004 | Toda | 365/185.21 |
| 2005/0188148 A1 | * | 8/2005 | Osakabe | 711/103 |

FOREIGN PATENT DOCUMENTS

JP      2002-7221      1/2002

* cited by examiner

*Primary Examiner* — Anh Phung
*Assistant Examiner* — Khamdan Alrobaie
(74) *Attorney, Agent, or Firm* — McGinn IP Law Group, PLLC

(57) ABSTRACT

A nonvolatile memory includes memory blocks each including a data storage area for storing user data and a discrimination area that is provided so as to correspond to the each data storage area on a one-to-one basis and stores discriminative data indicating a writing state of data to the data storage area. The nonvolatile memory further includes a control circuit which determines the data storage area that will be a storage destination of the user data based on a relative difference relation among the discriminative data of the respective memory blocks, and changes the discriminative data of the discrimination area corresponding to the data storage area in which the user data was written to a value different from that before the writing.

11 Claims, 15 Drawing Sheets

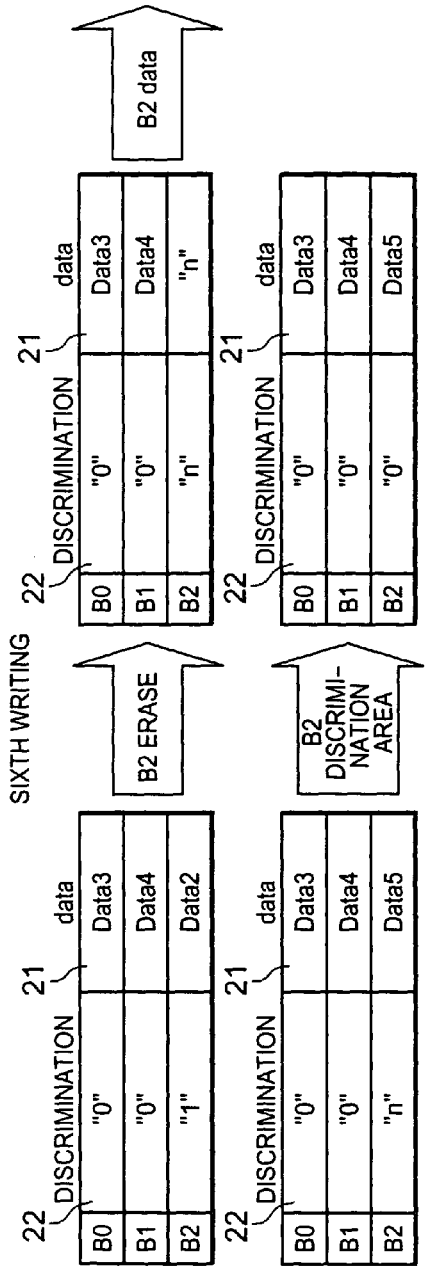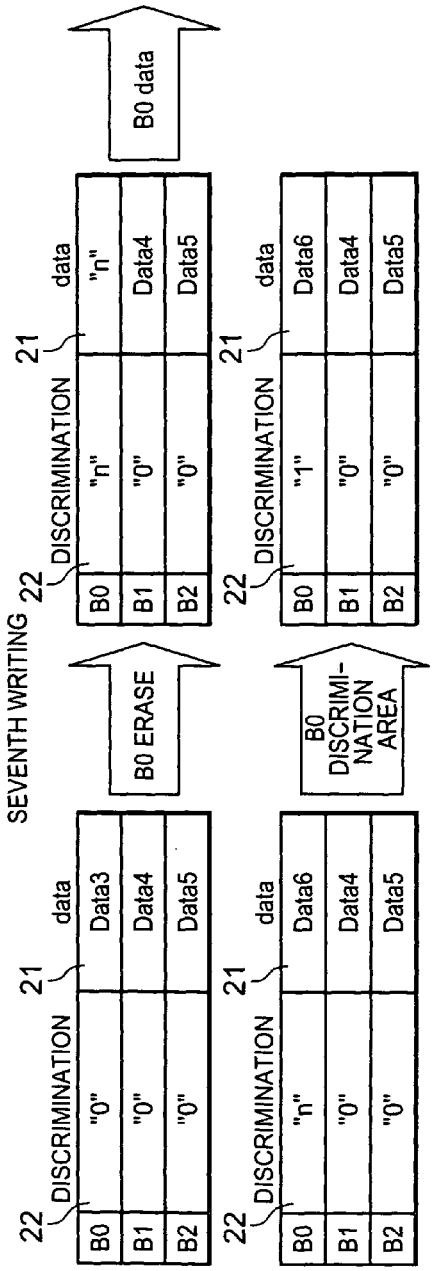

RELATED ART FIG. 22
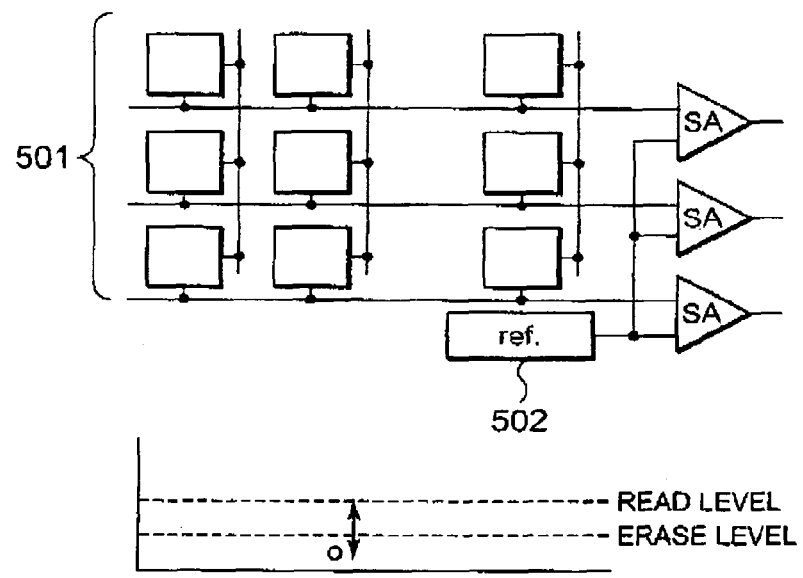
RELATED ART FIG. 23
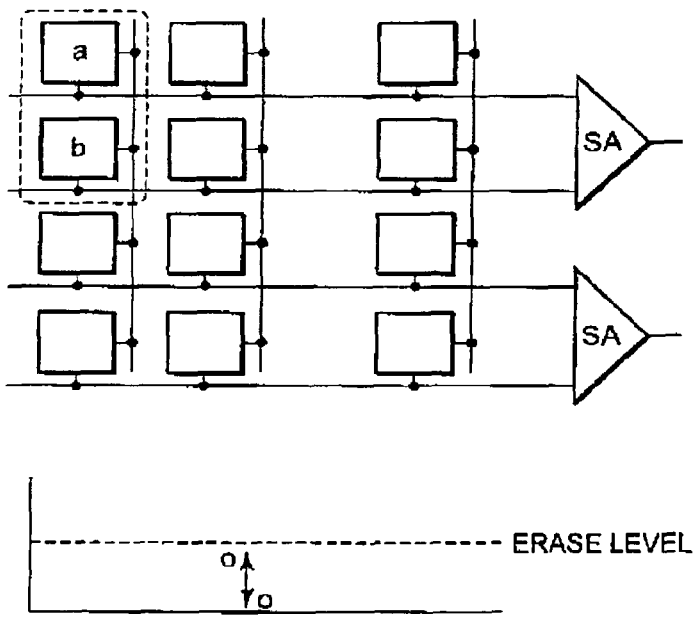

NONVOLATILE MEMORY HAVING PLURALITY OF MEMORY BLOCKS EACH INCLUDING DATA STORAGE AREA AND DISCRIMINATION AREA

INCORPORATION BY REFERENCE

This application is based upon and claims the benefit of priority from Japanese Patent Application No. 2009-010475 which was filed on Jan. 21, 2009, the disclosure of which is incorporated herein in its entirety by reference.

BACKGROUND OF THE INVENTION

1. Field of the Invention

The present invention relates to rewritable nonvolatile memory, such as EEPROM (Electrically Erasable and Programmable Read Only Memory), and more specifically, to a technology for increasing the number of rewritable times thereof.

2. Description of Related Art

Development of EEPROM represented by flash memory is progressing in recent years. Although EEPROM can rewrite data, there is a maximum in its number of times of rewriting, and increase in the number of times of rewriting is being sought. However, with higher integration of LSI (Large Scale Integration), memory is asked for a lowered voltage, which has become hindrance of improvement in the number of times of rewriting.

In order to increase the number of times of rewriting, there is disclosed a configuration such that a sector constituting a data memory area is divided into plural memory blocks each having a size more than or equal to the data size of user adjustment data, and in the memory block, a user adjustment data area for the user adjustment data and a writing discrimination area for indicating whether the user adjustment data has been written are provided therein (refer to Patent Document 1, Japanese Patent Application Laid Open No. 2002-007221). In this configuration, a memory block where a value indicating an unwritten state stored in the writing discrimination area is searched, and new user adjustment data gets stored in the user adjustment data area of the memory block.

FIG. 22 shows a type of memory configuration. In this configuration, a read value is determined by comparing and amplifying a value of a selected memory cell 501 and a value of a reference circuit 502 with a sense amplifier SA. Therefore, it is possible to determine whether the read value is "1" or "0" by setting a cell value after erasing lower than the reference circuit 502 and setting the cell value after writing higher than the reference circuit 502. The Patent Document 1 is predicated on application to the type of the memory configuration.

FIG. 23 shows a configuration of complementary type memory. In this configuration, the sense amplifier SA compares the values of the two cells a, b that make a pair and performs determination of "1" or "0" according to which is higher. Since this configuration does not need a reference circuit, it is advantageous to voltage lowering.

SUMMARY

However, in the complementary type configuration described above, since the cells a, b after the erasing takes an initial state (e.g., "1"), an output of the SA at this time becomes indeterminate. Therefore, in the case where the configuration as that of the Patent Document 1 is applied to the complementary memory, it is necessary to write an initial value in the cell a or b in advance. However, such a processing causes a loss in the number of times of rewriting. Therefore, in the complementary type memory, there is a problem that even if the configuration as shown in the Patent Document 1 is adopted, the number of rewritable times cannot be increased efficiently.

A nonvolatile memory of an exemplary aspect includes memory blocks each including a data storage area for storing user data and a discrimination area that is provided so as to correspond to the each data storage area on a one-to-one basis and stores discriminative data indicating a writing state of data to the data storage area. The nonvolatile memory further includes a control circuit which determines the data storage area that will be a storage destination of the user data based on a relative difference relation among the discriminative data of the respective memory blocks, and changes the discriminative data of the discrimination area corresponding to the data storage area in which the user data was written to a value different from that before the writing.

According to the exemplary aspect, when the user data is written in the data storage area of a certain recording block, the discriminative data of the discrimination area of the memory block will be changed. For example, when the user data is written in the data storage that corresponds to the discrimination area where "0" was stored as the discriminative data, the discriminative data will be reversed to "1." Then, by checking a relative difference relation between the discriminative data of the memory blocks, it is possible to judge in which memory block the latest (or oldest) user data is stored and the like, which enables the storage destination of the new user data to be properly decided. Thereby, the number of times of rewriting of one sector can be increased according to the number of memory blocks constituting the sector. For example, when each sector having the number of rewritable times of 100 K is divided into three memory blocks of the first to third memory ones, rewriting of the user data is stored in the data storage area of the each memory block by repeating an order, for example, the first block→the second→the third→the first→the second→ . . . sequentially, whereby the rewriting of about 300 K becomes possible. Moreover, according to the present invention, it is not necessary to write an initial value in the discrimination area in advance when rewriting the user data, even in the case of the complementary memory not equipped with a circuit for generating a reference signal or the like, there does not arise a loss in the number of times of rewriting.

According to the exemplary aspect, the number of rewritable times can be increased efficiently also in memory with an indeterminate initial value, such as of a complementary type.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 10 is a diagram showing a state of a sixth writing processing in the writing processing according to the first exemplary embodiment;

FIG. 11 is a diagram showing a state of a seventh writing processing in the writing processing according to the first exemplary embodiment;

FIG. 22 is a diagram showing a configuration example of a type memory of a related art; and FIG. 23 is a diagram showing a configuration example of a complementary type memory.

DETAILED DESCRIPTION OF THE EXEMPLARY EMBODIMENTS

First Exemplary Embodiment

Figure 1:
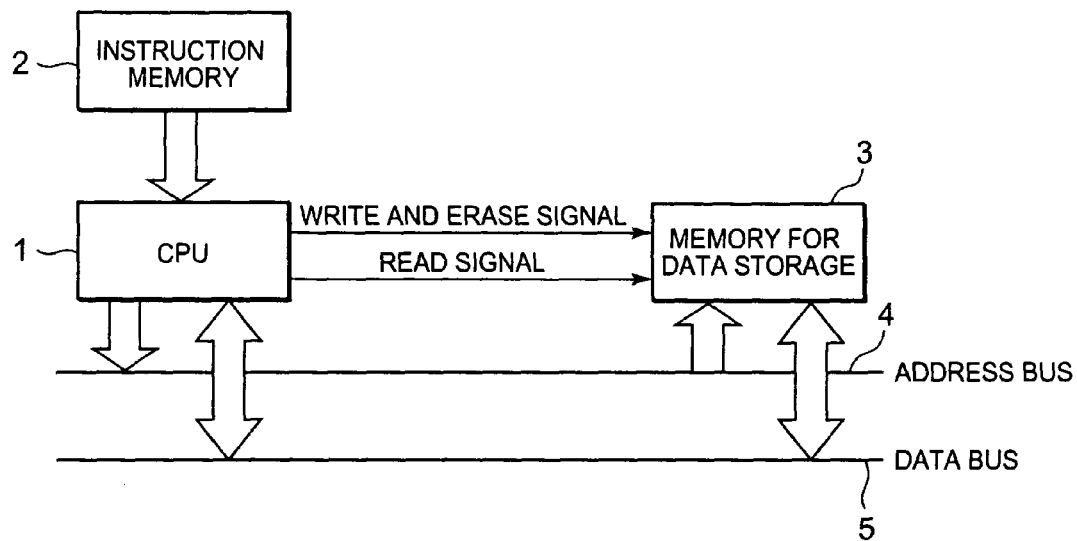
FIG. 1 is a block diagram showing a configuration example of a computer system to which the present invention is applied.

FIG. 1 is a block diagram showing a configuration example of a computer system to which the present invention is applied. The computer system is equipped with a CPU (Central Processing Unit) 1, instruction memory 2, memory 3 for data storage, an address bus 4, and a data bus 5.

The CPU 1 is an electronic circuit for performing various information processings, such as writing of user data that will be described later, according to a program stored in the instruction memory 2. The instruction memory 2 is made up of ROM (Read Only Memory), RAM (Random Access Memory), or cooperation of them, and stores the program for making the CPU 1 drive. The memory 3 for data storage is configured to include rewritable nonvolatile memory, such as EEPROM (including flash memory), included and enables various data (the user data) to be written and read. The address bus 4 transmits a physical address of an element and a position of the data stored in the memory 3 for data storage, and the data bus 5 transmits the data itself. Note that the present invention is not restricted to the configuration of such a computer system, and permits various kinds of design changes. For example, it is also possible to implement the means for performing a control according to the present invention thoroughly in a way of hardware of the memory 3 for data storage, without using the CPU 1 and the instruction memory 2.

Figure 2:
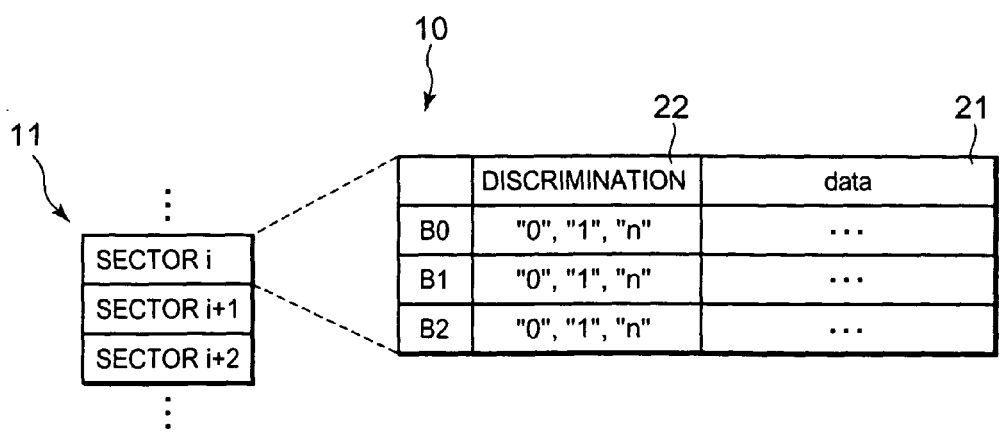
FIG. 2 is a block diagram showing a structure of a memory area of nonvolatile memory according to a first exemplary embodiment.

FIG. 2 shows a configuration of nonvolatile memory 10 that constitutes a part of the memory 3 for data storage. A data memory area of the nonvolatile memory 10 is divided into plural sectors i, i+1, i+2, . . . and each of the sectors i, i+1, i+2, . . . is further divided into plural memory blocks B0, B1, and B2. In the exemplary embodiment, each of the sectors i, i+1, i+2, . . . is made up of the first memory block B0, the second memory block B1, and the third memory block B2. Incidentally, although the present invention is not restricted to the above-mentioned number of the memory blocks, here in order to simplify the explanation, a configuration having the above-mentioned three memory blocks B0, B1, and B2 will be explained. Naturally, it may be all right that each of the sectors i, i+1, and i+2 has a different number of blocks.

Each of the memory blocks B0, B1, and B2 has a data storage area 21 and a discrimination area 22, respectively. The data storage area 21 is an area that stores arbitrary user data, i.e., data generated by an operation of a user of the computer system, data for program update, and other data generated by various processings. The discrimination area 22 is an area that is provided so as to establish a one-to-one correspondence to the each data storage area 21, and that stores discriminative data indicating a data writing state to the corresponding data storage area 21. The discriminative data in the exemplary embodiment is set to the value "0" or "1" that is in a mutually reverse relation according to the data writing state to the corresponding data storage area 21, and shows an indeterminate value at the time of an initial stage.

Assuming that in the complementary memory shown in the FIG. 23 described above, the discriminative data "0" is an output value (a read value) of a sense amplifier SA when the values of the two memory cells a, b whose retained value are inputted to the SA, the discriminative data "1" is the read value of the SA when the values of the memory cells a, b are "10." Moreover, the discriminative data "n" is a value when the values of the memory cells a, b are "00" or "11" and the read value of the SA becomes indeterminate.

Figure 3:
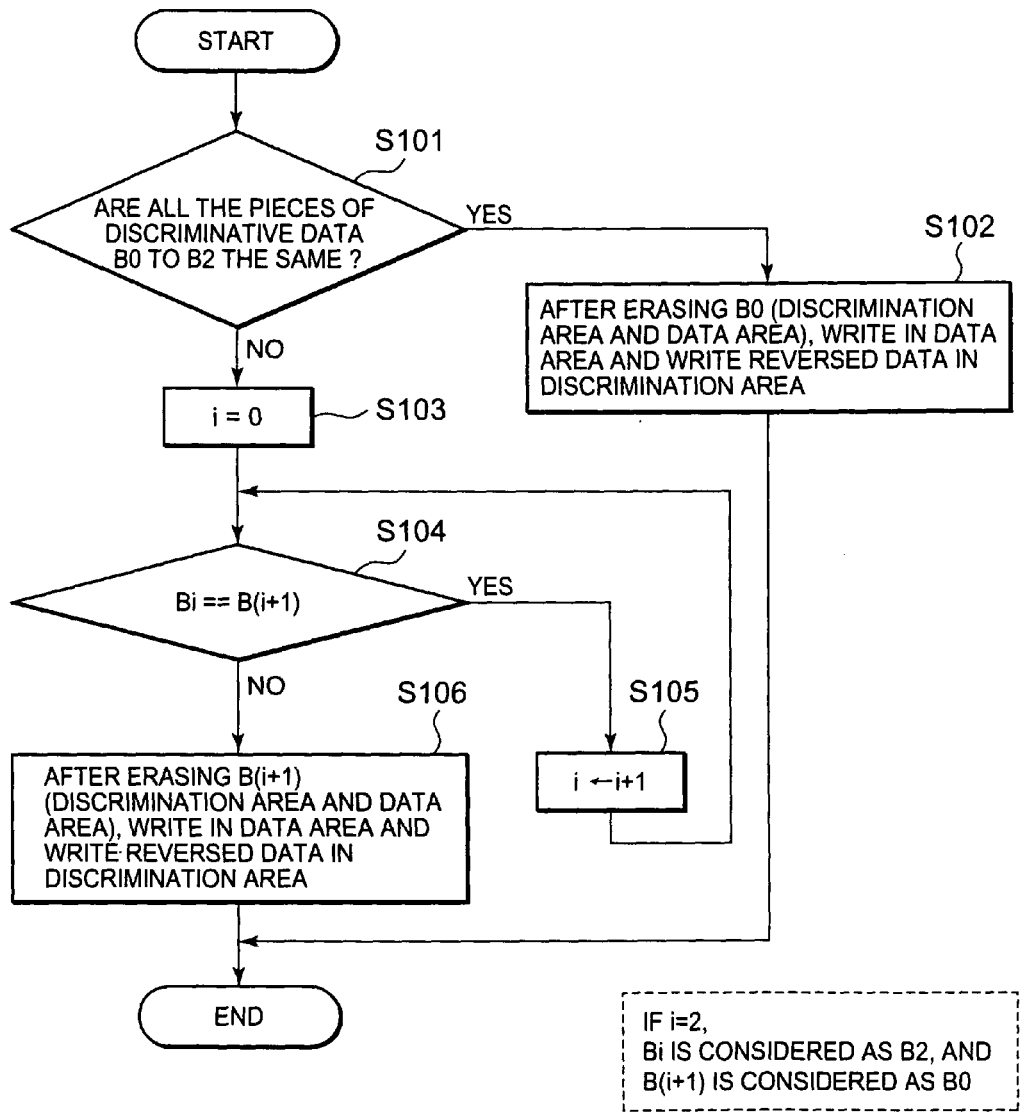
FIG. 3 is a flowchart showing the flow of a writing processing of user data according to the first exemplary embodiment.

FIG. 3 shows a processing when writing the user data in the data storage area 21 in the exemplary embodiment. In this processing, first, it is determined whether values of all pieces of the discriminative data of the memory blocks B0, B1, and B2 are the same. If it is determined that all pieces of the discriminative data are the same in S101 (Y), then the discrimination area 22 and the data storage area 21 of the first memory block B0 are erased (initialization), the user data is written in the data storage area 21, and at the same time the discriminative data of the discrimination area 22 is reversed (S102). That is, if the discriminative data before the writing is "0," then it is changed to "1"; if the discriminative data before the writing is "1," then it is changed to "0." This change (reversal) processing of the discriminative data is performed by reversing the values of the memory a, b corresponding to the discrimination area 22 concerned, respectively.

On the other hand, in the S101, if it is determined that all pieces of the discriminative data are not the same, then values of variables i (0 to 2) indicating the first to third hierarchies of the memory blocks Bi are set to 0 (S103), and it is determined whether the discriminative data of the memory block Bi and the discriminative data of the next memory block B(i+1) coincide with each other (S104). In S104, if the both memory blocks Bi and B(i+1) coincide with each other (Y), then unity is added to i (S105) and the S104 is performed again. In doing this, if i=2 holds, then B(i+1) is presupposed to be B0.

Then, in S104, if it is determined that the both memory blocks Bi and B(i+1) do not coincide with each other, the discrimination area 22 and the data storage area 21 of the memory block B(i+1) are erased (initialization), then the user data is written in the data storage area 21, and at the same time the discriminative data of the discrimination area 22 is reversed (changed to "0") (S102). By S104, it becomes possible to determine a boundary position at which the pieces of the discriminative data of the memory blocks B0, B1, and B2 are relatively different from one another.

Figure 4:
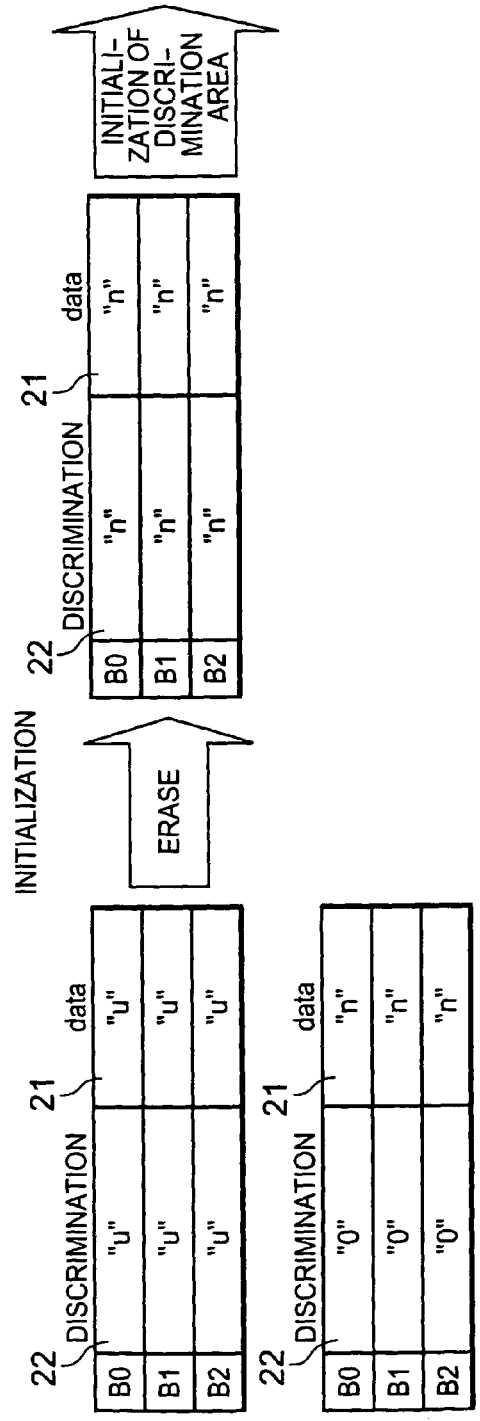
FIG. 4 is a diagram showing a state at the time of initializing a memory block in the writing processing according to the first exemplary embodiment.

FIG. 4 to FIG. 12 show a transitional state when eight times writing is performed on the memory blocks B0, B1, and B2 by the above-mentioned processing. First, FIG. 4 shows a state when initializing the memory blocks B0, B1, and B2. At this time, first, the predetermined data "u" stored in the data storage area 21 and the discrimination area 22, respectively, are erased, and both the areas 21, 22 are set to "n" indicating an indeterminate state. Subsequently, the discrimination area 22 is initialized and the discriminative data "0" is stored in all the areas.

Figure 5:
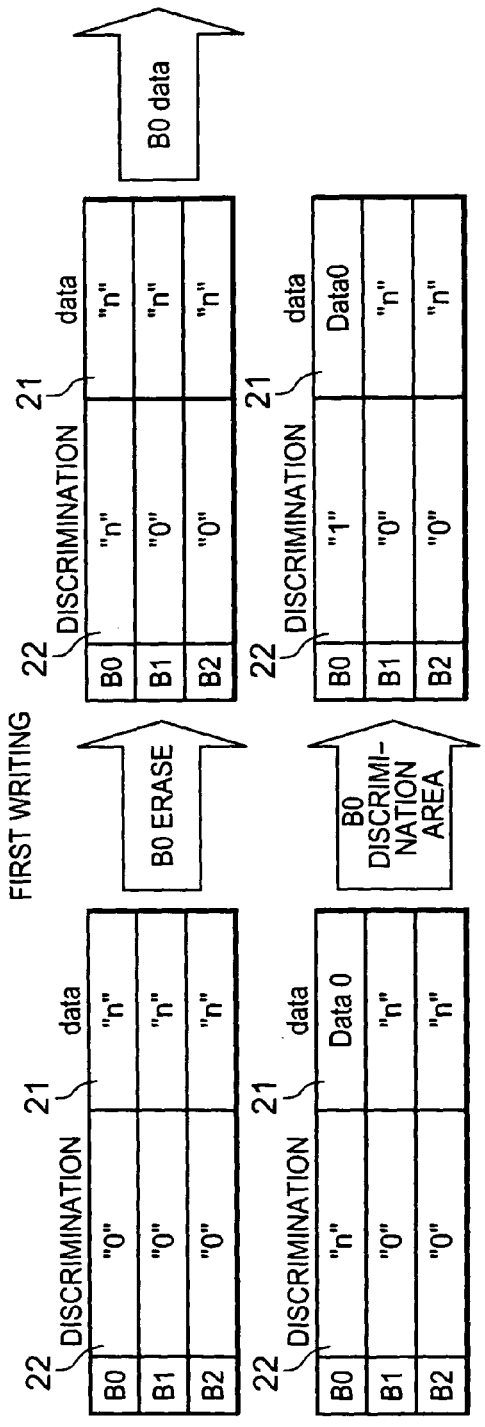
FIG. 5 is a diagram showing a state of a first writing processing in the writing processing according to the first exemplary embodiment.

FIG. 5 shows a state at the time of a first writing. At this time, it is assumed that a writing instruction of first user data Data0 is issued to the memory 3 for data storage from the CPU 1. At this time, first, the discrimination area 22 of the first memory block B0 is erased, and its discriminative data is set to "n." Subsequently, the first user data Data0 is written in the data storage area 21 of the first memory block B0. Then, the discriminative data of the discrimination area 22 of the first memory block B0 is changed to "1" that is a value obtained by reversing the value before the writing. Such a processing is performed by being led by the determination that all the values of the discrimination area 22 in the S101 shown in FIG. 3 are the same.

Figure 6:
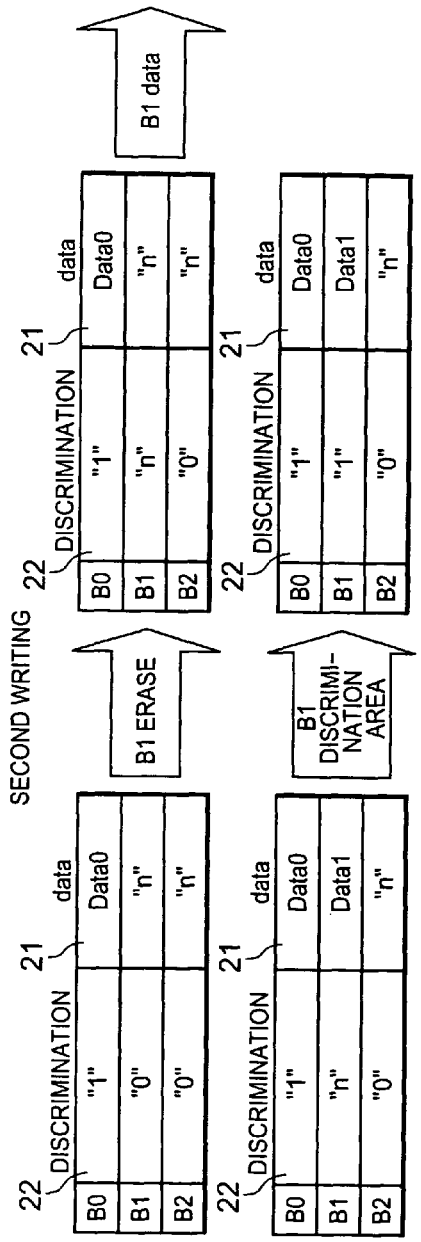
FIG. 6 is a diagram showing a state of a second writing processing in the writing processing according to the first exemplary embodiment.

FIG. 6 shows a state at the time of a second writing. At this time, it is assumed that the CPU 1 issues a write instruction of second user data Data1. At this time, first, the discrimination area 22 of the second memory block B1 is erased, and its discriminative data becomes "n." Subsequently, the second user data Data1 is written in the data storage area 21 of the second memory block B1. Then, the discriminative data of the discrimination area 22 of the second memory block B1 is changed to "1" that is a value obtained by reversing the value before the writing and is stored. Such a processing is performed being led by a determination that not all the values of the discrimination area 22 in the S101 shown in FIG. 3 are the same and by a boundary position at which the pieces of the discriminative data being made clear in the S104 are relatively different.

Figure 7:
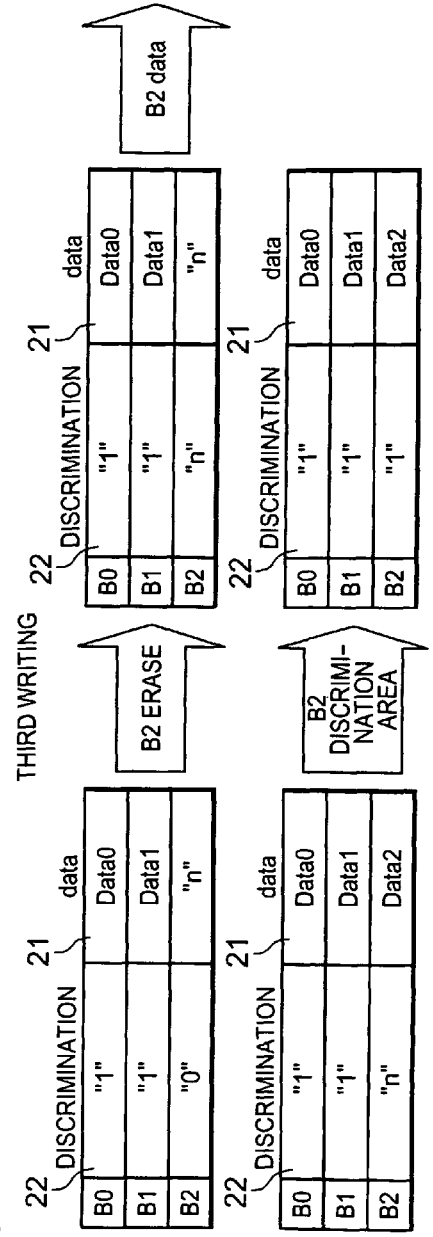
FIG. 7 is a diagram showing a state of a third writing processing in the writing processing according to the first exemplary embodiment.

FIG. 7 shows a state at the time of a third writing. At this time, by the same processing as that of the time of the above-mentioned second writing, first, the discrimination area 22 of the third memory block B2 is erased, its discriminative data becomes "n" from "0," subsequently, third user data Data2 is written in the data storage area 21 of the third memory block B2, and finally the discriminative data of the discrimination area 22 of the third memory block B2 becomes "1."

Figure 8:
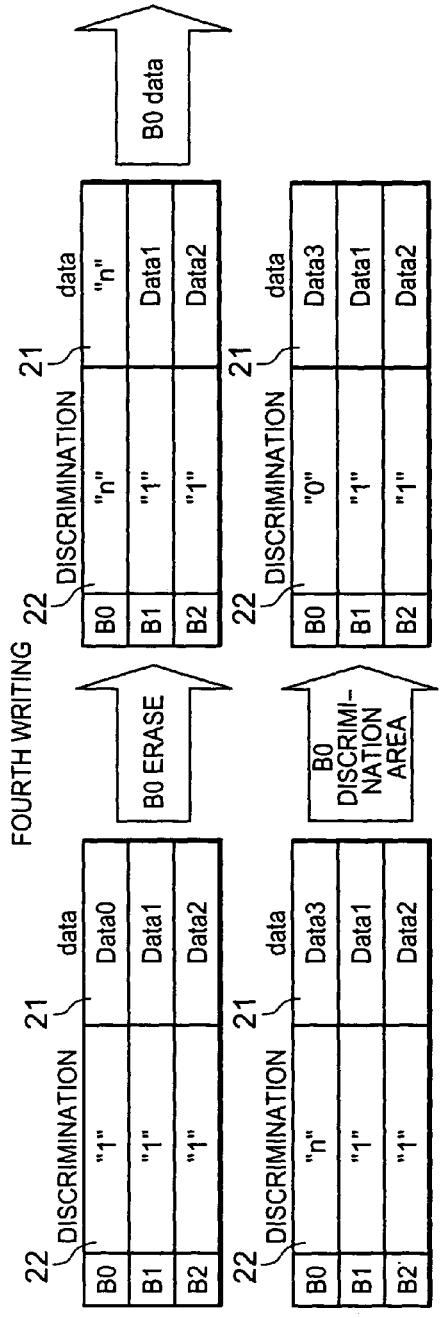
FIG. 8 is a diagram showing a state of a fourth writing processing in the writing processing according to the first exemplary embodiment.

FIG. 8 shows a state at the time of a fourth writing. At this time, since the discriminative data of all the discrimination areas 22 is "1," similarly with the first writing time shown in the above-mentioned FIG. 5, fourth user data Data3 is written in the data storage area 21 of the first memory block B0, and at the same time the discriminative data of the discrimination area 22 of the first memory block B0 is changed from "1" to "0." Thus, after writing the user data in all the three memory blocks B0, B1, and B2, the new user data Data 3 is overwritten in the data storage area 21 where the oldest user data Data0 is stored.

Figure 9:
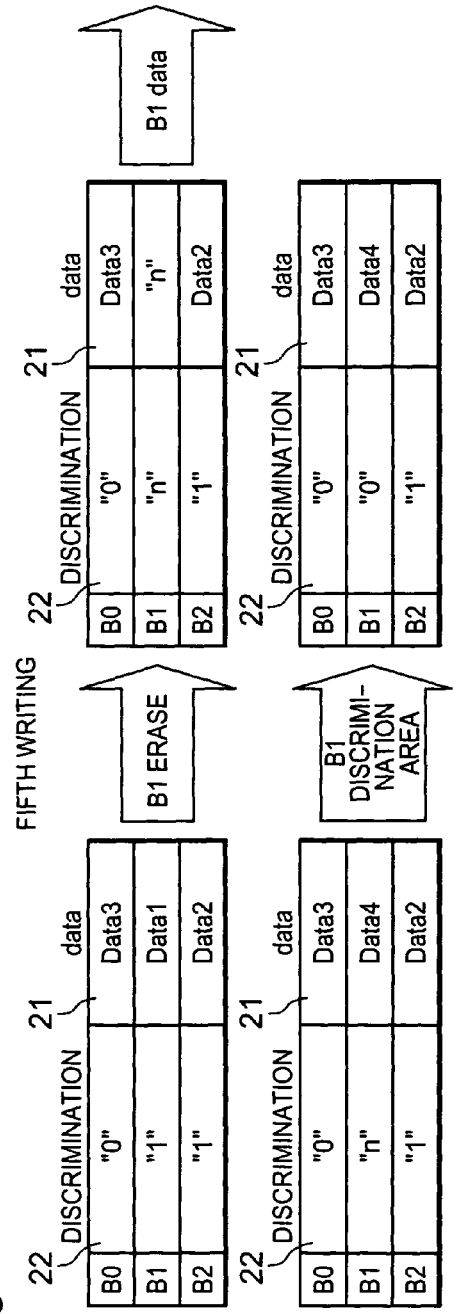
FIG. 9 is a diagram showing a state of a fifth writing processing in the writing processing according to the first exemplary embodiment.

FIG. 9 shows a state at the time of a fifth writing. At this time, since the discriminative data of the first memory block B0 is "0" and the discriminative data of the second memory block B1 becomes "1," similarly with the second writing time shown in the above-mentioned FIG. 6, fifth user data Data4 is written in the data storage area 21 of the second memory block B1, and at the same time the discriminative data of the discrimination area 22 of the second memory block B1 is changed from "1" to "0."

FIG. 10 shows a state at the time of a sixth writing. At this time, since the discriminative data of the second memory block B1 is "0" and the discriminative data of a third memory block B2 becomes "1," similarly with the third writing shown in the above-mentioned FIG. 7, sixth user data Data5 is written in the data storage area 21 of the third memory block B2, and at the same time the discriminative data of the discrimination area 22 of the third memory block B2 is changed from "1" to "0."

FIG. 11 shows a state at the time of a seventh writing. Since at this time, the discriminative data of all the discrimination areas 22 becomes "0" again, similarly with the first or fourth writing shown in the above-mentioned FIG. 5 or FIG. 8, seventh user data Data6 is written in the data storage area 21 of the first memory block B0, and at the same time the discriminative data of the discrimination area 22 of the first memory block B0 is changed from "0" to "1."

Figure 12:
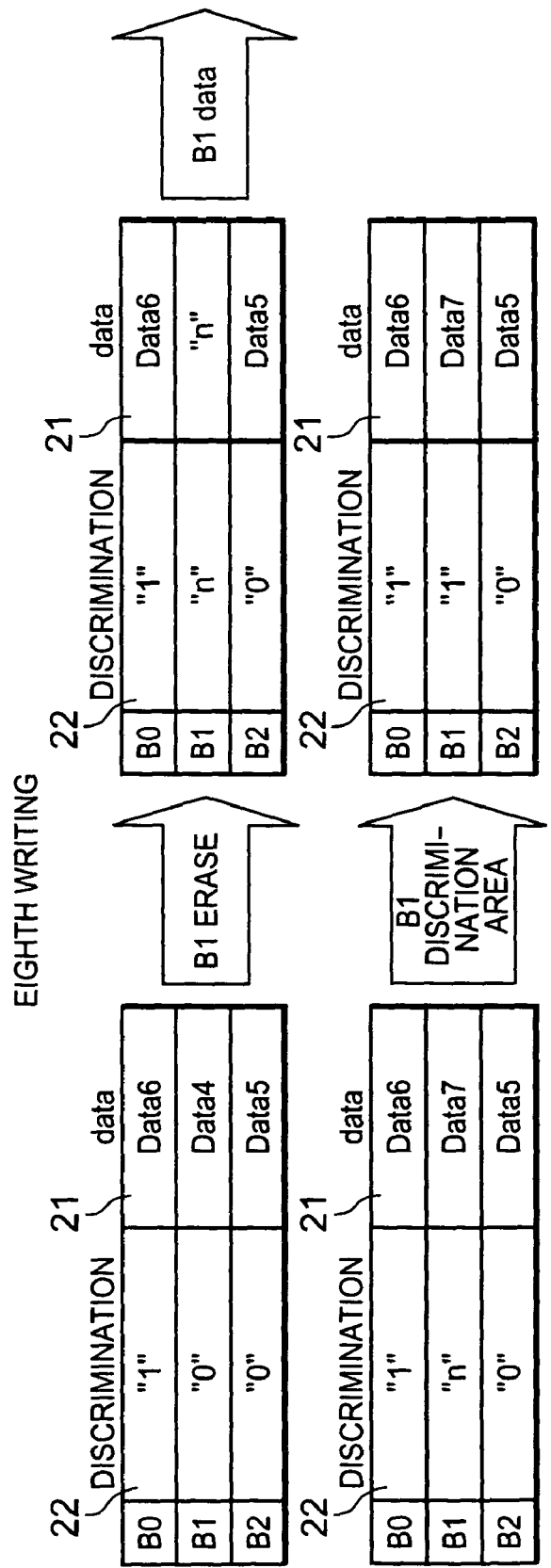
FIG. 12 is a diagram showing a state of an eighth writing processing in the writing processing according to the first exemplary embodiment.

FIG. 12 shows a state at the time of an eighth writing. Since at this time, the discriminative data of the first memory block B0 is "1" and the discriminative data of the second memory block B1 becomes "0," similarly with the time of the second or fifth writing shown in the above-mentioned FIG. 6 or 9 eighth user data Data7 is written in the data storage area 21 of the second memory bock B1, and at the same time the discriminative data of the discrimination area 22 of the second memory bock B1 is changed from "0" to "1."

Figure 13:
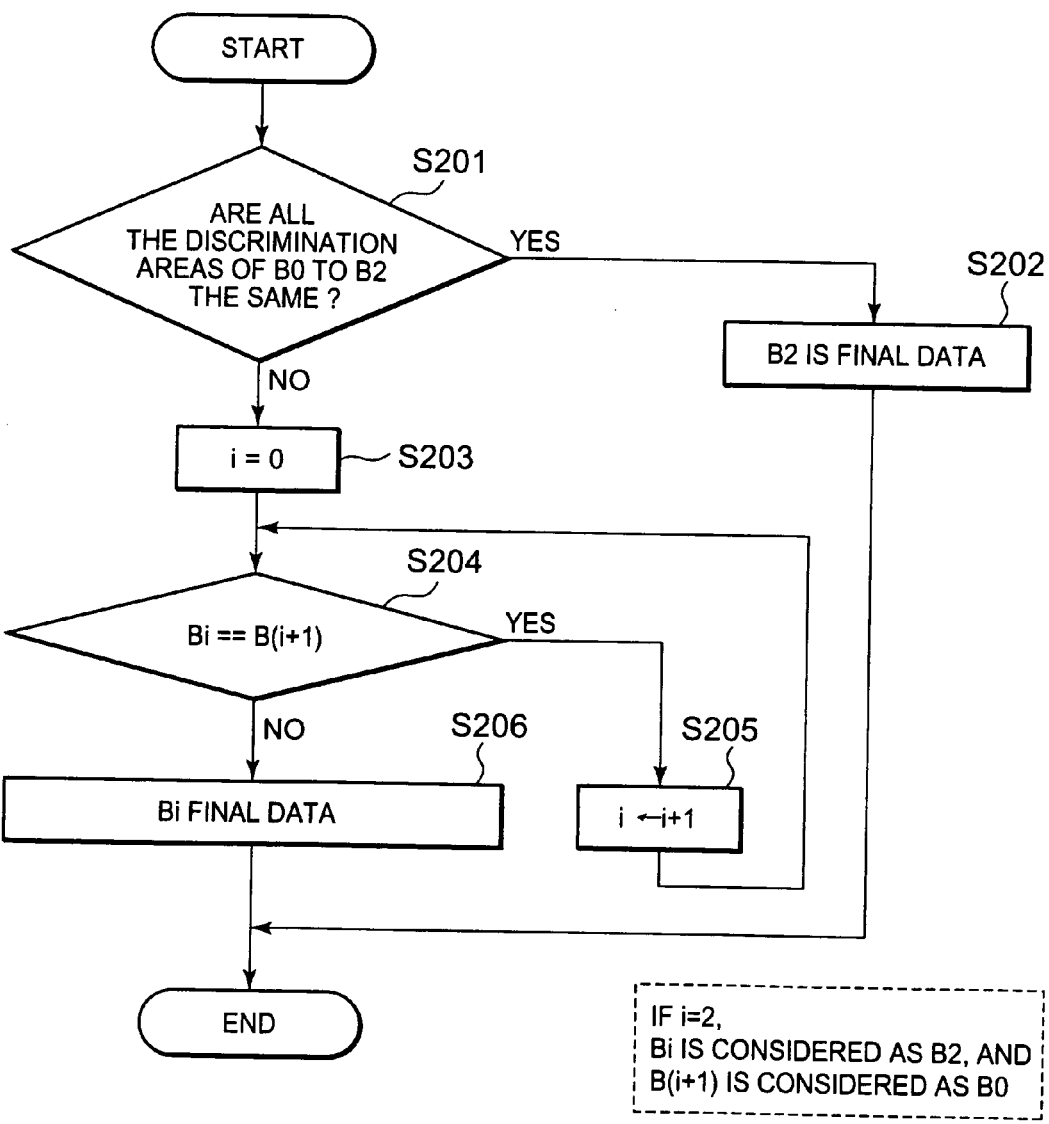
FIG. 13 is a flowchart showing the flow of a reading processing of the user data according to the first exemplary embodiment.

In addition, FIG. 13 shows a processing when reading the user data stored in the above-mentioned manner. In this processing, first, it is determined whether all the values of the discriminative data of the respective memory blocks B0, B1, and B2 are the same (S201). In S201, if it is determined that all pieces of the discriminative data are the same (Y), then it is determined that the final (latest) user data is stored in the third memory block B2 (S202).

On the other hand, if in the S201, then it is determined that all pieces of the discriminative data are not the same (N), values of the variable i (0 to 2) showing first to third hierarchies of the memory block Bi (S203) are set to 0 (S203), and it is determined whether the discriminative data of a certain memory block Bi and the discriminative data of the next memory block B(i+1) coincide with each other (S204). In 5204, if both the memory blocks Bi and B(i+1) coincide with each other (Y), then unity is added to i (S205) and the S204 is performed again. At this time, if i=2 holds, then B(i+1) is presupposed to be B0.

Then, in the S204, if it is determined that both the memory blocks Bi and B(i+1) do not coincide with each other (N), then it is determined that the final user data is stored in the memory block B(i+1) (S206). Thereby, it becomes possible to always read the latest user data.

As described above, according to this configuration, it is possible to judge in which memory block the latest (or oldest) user data is stored etc. based on a relative difference relation between pieces of discriminative data of the memory blocks B0, B1, and B2, and to decide a storage destination of the new user data properly. Moreover, since it is not necessary to write an initial value in the discrimination area 22 in advance when rewriting the user data, even if memory is a complementary type memory that is not equipped with a circuit for generating a reference signal etc., there arises no loss in the number of times of rewriting.

Second Exemplary Embodiment

Figure 14:
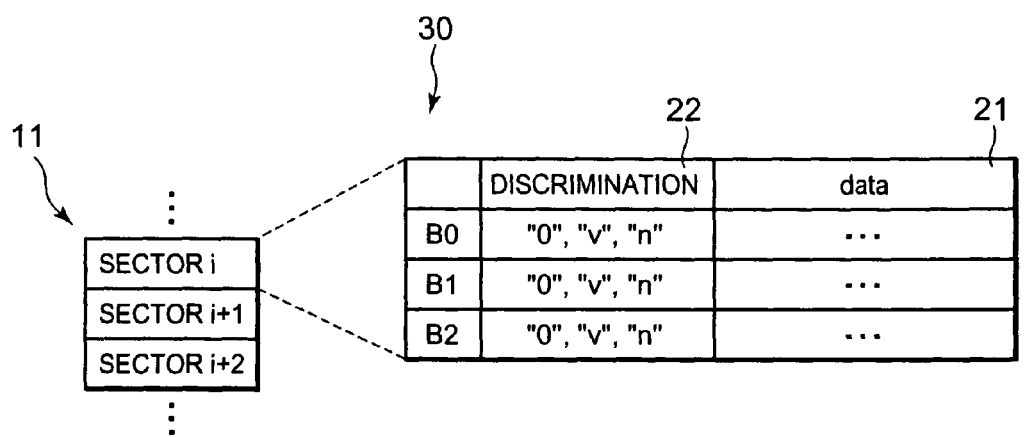
FIG. 14 is a block diagram showing a structure of a memory area of nonvolatile memory according to a second exemplary embodiment.

As shown in FIG. 14, nonvolatile memory 30 according to a second exemplary embodiment uses "0," "v," and "n" as the discriminative data. The discriminative data "0" and "n" are the same as those of the first exemplary embodiment. The discriminative data "v" shows a void state that will be described later.

Figure 15:
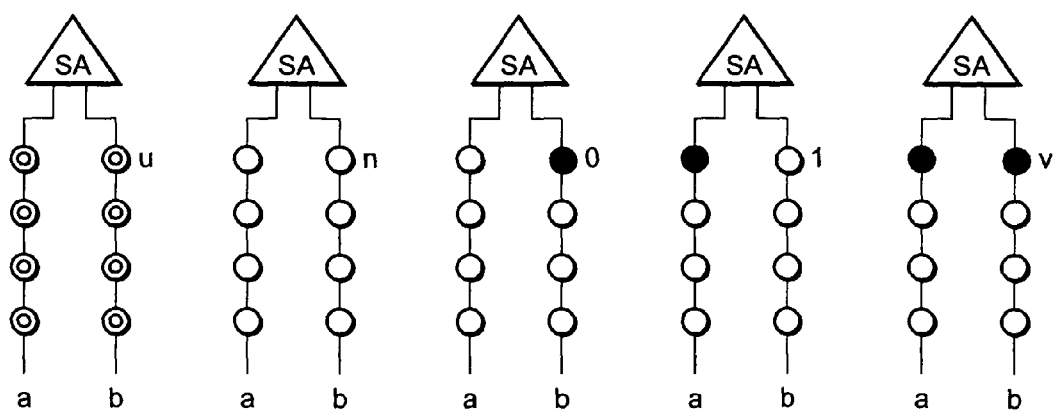
FIG. 15 is a diagram showing a relation of the value of the memory cell and discriminative data in the second exemplary embodiment.
Figure 16:
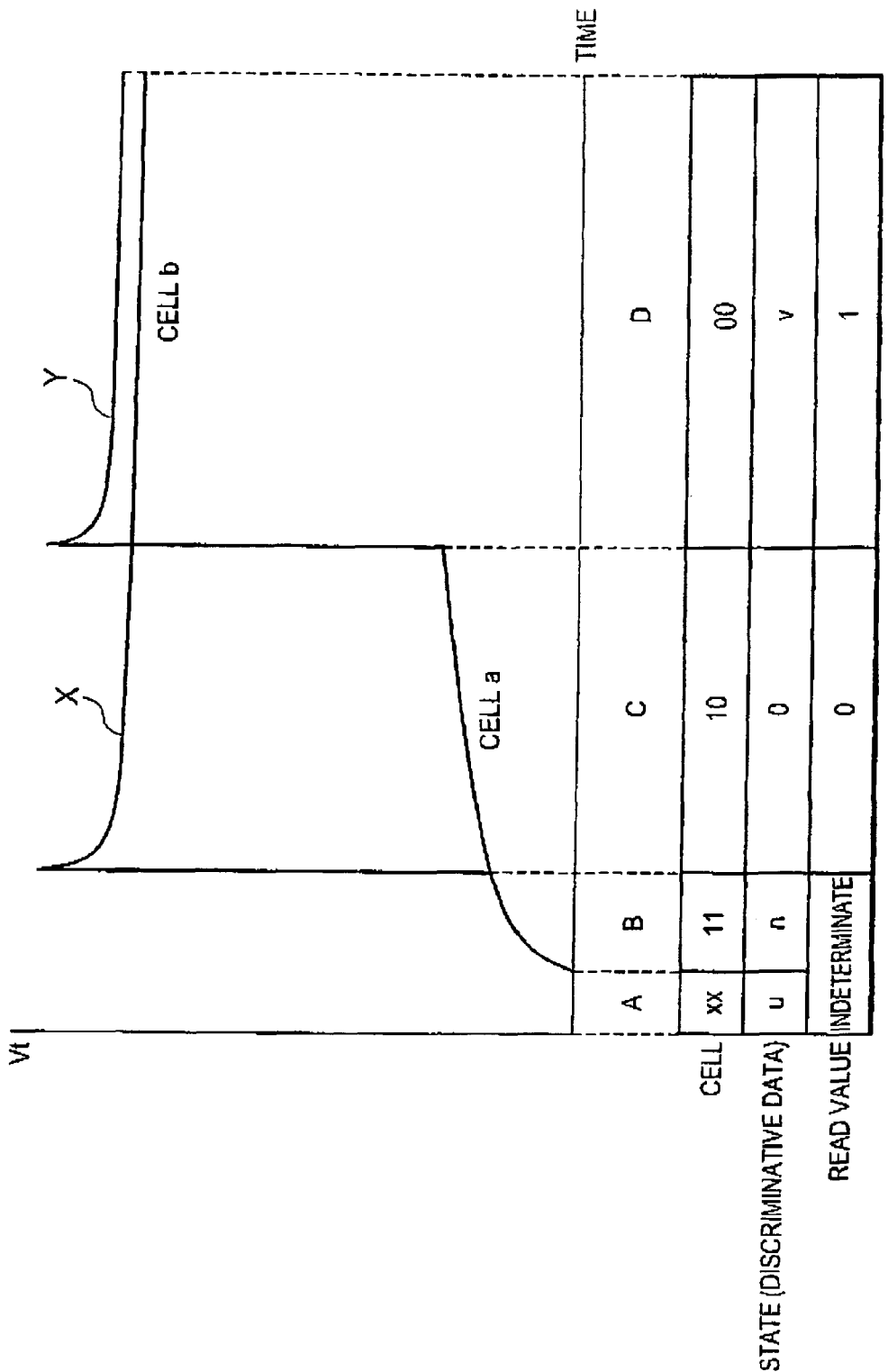
FIG. 16 is a diagram that shows a relation between a retention voltage value of the memory cell and a time, and at the same time shows a relation among a cell value, the discriminative data, and a read value of a sense amplifier in the second exemplary embodiment.

FIG. 15 and FIG. 16 show a relation of values of the memory cells a, b and the discriminative data in the second exemplary embodiment. A leftmost diagram in FIG. 15 shows a state before the initialization of the memory cells a, b, and the state at this time (discriminative data) is designated as "u(unknown)," the read value of the SA being set to be indeterminate. A second diagram from the left in FIG. 15 shows a state after the initialization of the memory cells a, b (values of the memory cells a, b is [11]) and before the writing, and the discriminative data at this time becomes "n(null)," the read value of the SA becoming indeterminate. A center diagram in FIG. 15 shows a state where values of the memory cells a, b are "10" and the discriminative data becomes "0." A second diagram from the right in FIG. 15 shows a state where values of the memory cells a, b are "01" and the discriminative data becomes "1." A rightmost diagram in FIG. 15 shows a state where values of the memory cells a, b are "00" and the discriminative data becomes "v(void)." The read value of the SA at this time becomes indeterminate. However, when a state of the central diagram (read value "0") changes to a state of the rightmost diagram with some time difference, the read value of the rightmost diagram can be considered as "1." Moreover, similarly, when a state of the second diagram from the right (read value "1") changes to a state of the rightmost diagram with some time difference, the read value of the rightmost diagram can be considered as "0." This will be explained using FIG. 16.

FIG. 16 shows a relation among the retention values of the memory cells a, b, the discriminative data, and the read value of the SA, and here shown is an example where the discriminative data changes like "u"→"n"→"0"→"v." As shown in the figure, in the stage A before the initialization, the read value is indeterminate (the discriminative data is "u"). In a stage B after the initialization and before the cell writing, the read value becomes indeterminate (the discriminative data is "n"). After that, in a stage C where "0" is written in the cell b, the read value becomes "0" (the discriminative data is "0"). Then, in a stage D, by writing "0" in the cell a on the erase side in the stage C, the read value "0" of the stage C is reversed to become "1." The discriminative data at this time will become the void state "v."

In the stage D, if "0" is written in the cell a on the erase side, since a difference disappears between the voltage values of both the cells a, b theoretically, then a cell value can be expressed as "00" and the read value at this time will becomes "n." However, actually, as shown in lines X, Y of FIG. 16, since the voltage value of the cell tends to decrease gradually in time, the voltage value of the cell a written later becomes larger than the voltage value of the cell b written early. For this reason, the read value after writing to the cell a becomes "1." Although FIG. 16 explained the case where the writing to the cell b was performed first ("10"), the case where the procedure is opposite is also the same.

Figure 17:
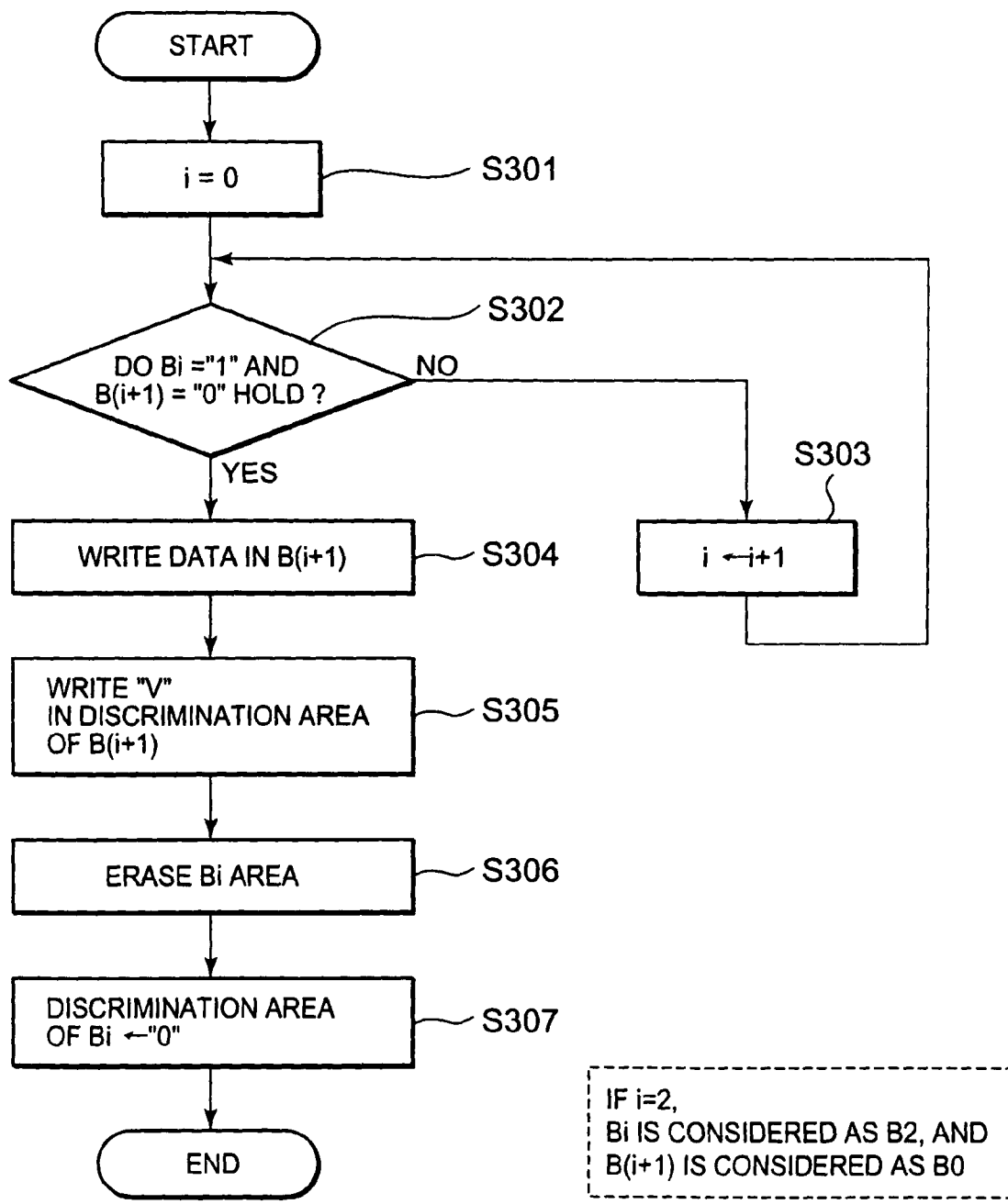
FIG. 17 is a flowchart showing the flow of the writing processing of the user data according to the second exemplary embodiment.

The exemplary embodiment is such that writing control to the nonvolatile memory 30 is performed using the discriminative data "v" (read value "1") indicating such a void state as mentioned above. FIG. 17 shows the flow of the writing control in the exemplary embodiment. In this control, first, values of i (i=0, 1, and 2) showing the hierarchies of the memory blocks B0, B1, and B2 (refer to FIG. 14) are set to "0" (S301), and subsequently, it is determined whether the read value of Bi is "1" (the discriminative data is "v") and the read value of B(i+1) is "0" (S302). In S302, if a relation of both the read values is not satisfied (N), then unity is added to i (S303) and S302 is performed again. At this time, if i=2, then B(i+1) is presupposed to be B0.

If the relation of both the read values is satisfied in the S302 (Y), then desired user data will be written in B(i+1) (S304), and subsequently the discriminative data "v" (the read value "1") will be written in the discrimination area 22 of B(i+1) (S305). Then, the discrimination area 22 and the data area 21 of Bi are erased (initialization) (S306), and the discriminative data (the read value) "0" gets stored in the discrimination area 22 of Bi (S307).

Figure 18:
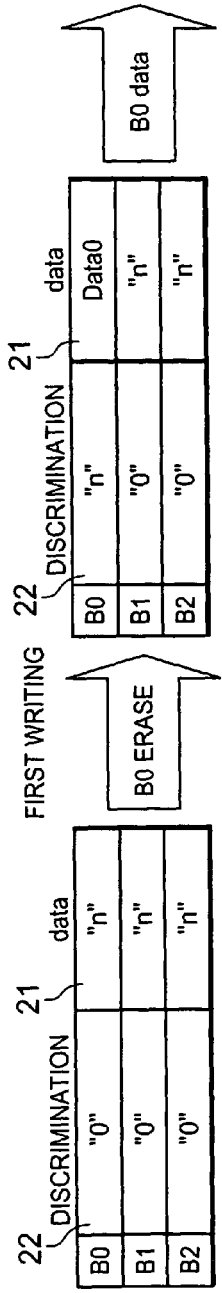
FIG. 18 is a diagram showing a state of the first writing processing in the writing processing according to the second exemplary embodiment.

FIG. 18 to FIG. 24 show the transitional state when the writing is performed on the memory blocks B0, B1, and B2 by the above-mentioned processing. Incidentally, regarding the initialization of each of the memory blocks B0, B1, and B2, it is the same as the case that is shown by FIG. 4 of the above-mentioned first exemplary embodiment. FIG. 18 shows a state at the time of a first writing. At this time, first the user data Data0 is written in the data storage area 21 of the first memory block B0. Subsequently, the discriminative data "0" stored in the discrimination area 22 of the first memory block B0 is changed to "v." That is, as described above, the discriminative data "v" is written by writing "0" in the cell on the erase side of the memory value ("01" or "10") that generates the discriminative data "0."

Figure 19:
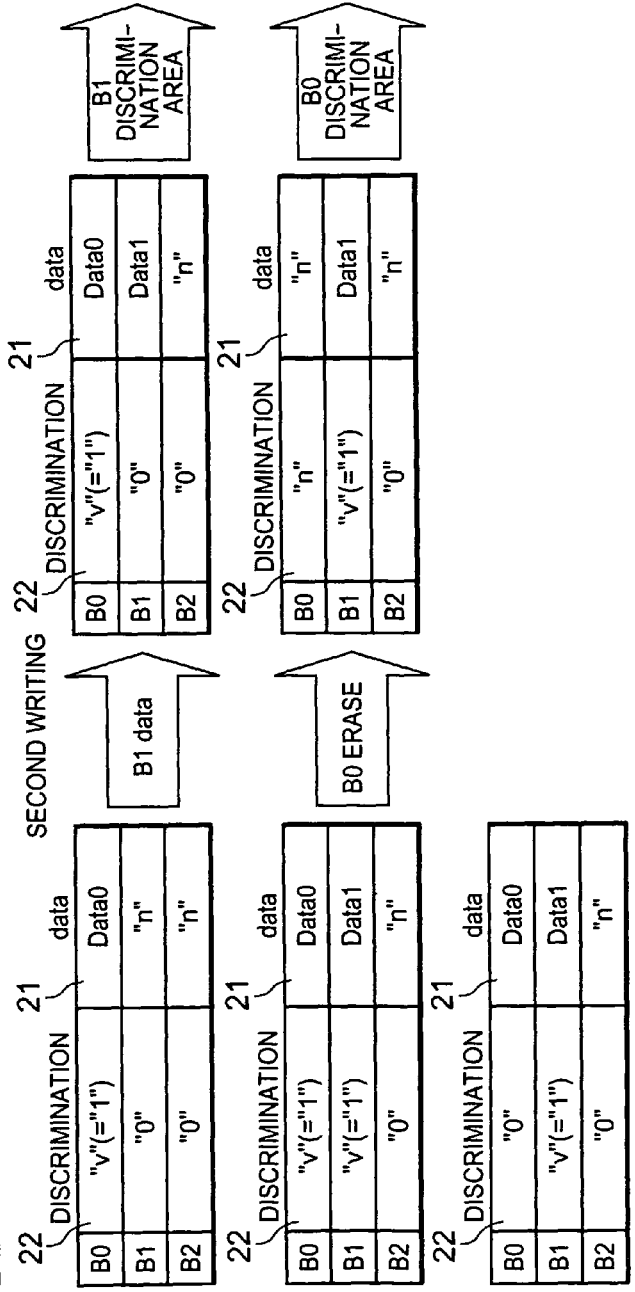
FIG. 19 is a diagram showing a state of the second writing processing in the writing processing according to the second exemplary embodiment.

FIG. 19 shows a state at the time of the second writing. At this time, first, the second user data Data1 is written in the data storage area 21 of the second memory block B1. Subsequently, the discriminative data "v" is written in the discrimination area 22 of the second memory block B1. Subsequently, the discrimination area 22 and the data storage area 21 of the first memory block B0 are erased. Finally, the discriminative data of the discrimination area 22 of the first memory block B0 is changed to "0."

Figure 20:
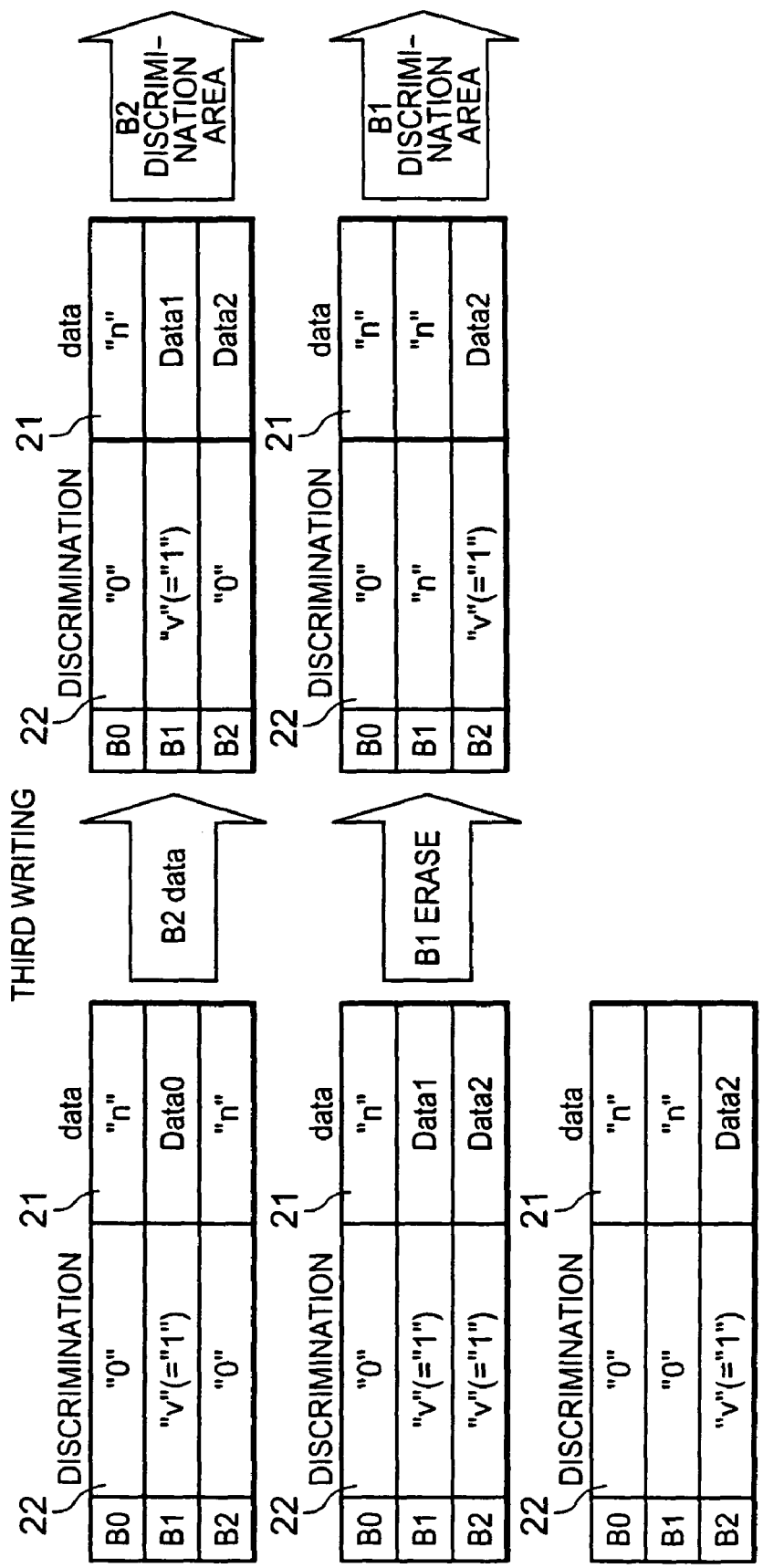
FIG. 20 is a diagram showing a state of the third writing processing in the writing processing according to the second exemplary embodiment.

FIG. 20 shows a state at the time of the third writing. At this time, the third user data Data2 is written in the data storage area 21 of the third memory block B2 by the same processing as of the time of the above-mentioned second writing, the discriminative data "v" is written in the discrimination area of the third memory block B2, both the areas 21, 22 of the second memory block B1 are erased, and the discriminative data of the discrimination area 22 of the second memory block B1 is changed to "0."

After this, a rewriting processing can be performed up to the number of rewritable times by repeating the same processing as of the time of the above-mentioned second or third writing.

Figure 21:
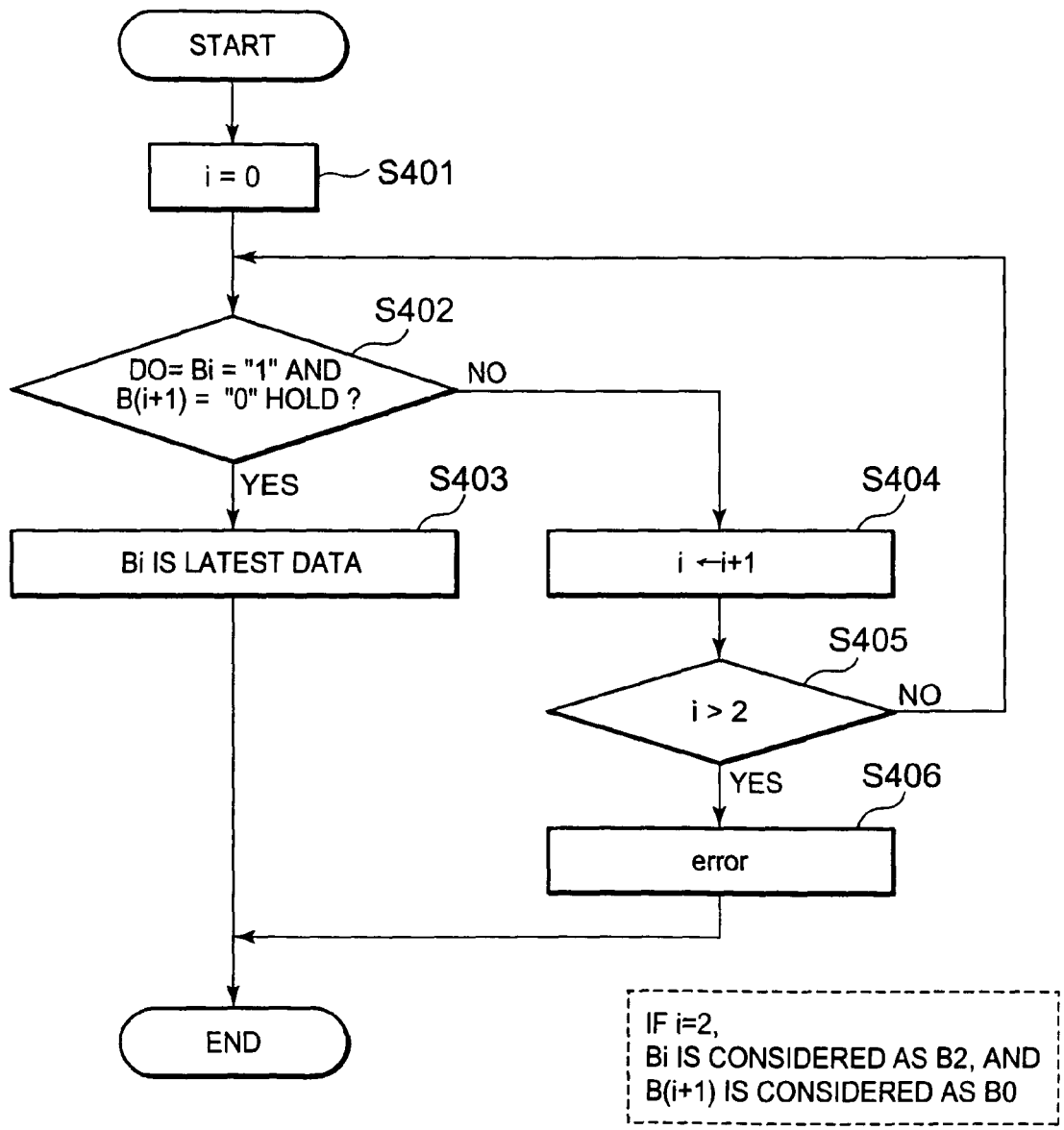
FIG. 21 is a flowchart showing the flow of a reading processing of the user data according to the second exemplary embodiment.

FIG. 21 shows a processing when reading the user data stored in the above-mentioned manner. In this processing, first, values of i (i=0, 1, and 2) showing the hierarchies of the memory blocks B0, B1, and B2 are set to "0" (S401), and subsequently, it is determined whether the read value of Bi is "1" (the discriminative data "v") and the read value of B($i$+1) is "0" (S402). At this time, if i=2 holds, then B($i$+1) is presupposed to be B0.

In S402, if the relation of both the read values is satisfied (Y), then it is determined that the user data stored in the data storage area 21 of Bi is the latest, and this will be read (S403). On the other hand, in the S402, if the relation of both the read values is not satisfied (N), then unity will be added to i (S404) and then it is determined whether i>2 is satisfied (S405). In S405, if it is determined that I>2 does not hold (N), then the S402 will be performed again; if it is determined that I>2 holds (Y), then it is determined that the error occurred (S406). Thereby, it becomes possible to always read the latest user data.

By using the discriminative data "v" indicating the void state like the above-mentioned exemplary embodiment, similarly with the above-mentioned exemplary embodiment, it becomes possible to efficiently write and read the user data based on the relative difference relation among pieces of the discriminative data of the respective blocks B0, B1, and B2. Moreover, in the second exemplary embodiment, since the memory block B0, B1, or B2 that has the relation to S302 of FIG. 17 and S402 of the FIG. 21 is always one pair, it becomes possible to determine which is the latest user data even when the power supply falls suddenly.

Further, it is noted that Applicant's intent is to encompass equivalents of all claim elements, even if amended later during prosecution.

What is claimed is:

1. A nonvolatile memory, comprising:
a plurality of data memory sectors each including a plurality of memory blocks, the plurality of memory blocks each including a pair of memory cells as a complementary type; and
a control circuit which controls writing of user data in the memory blocks; and detects one bit data by an electric potential difference of the pair of the memory cells,
wherein the plurality of memory blocks each includes:
a data storage area for storing the user data; and
a discrimination area that is provided so as to correspond to each data storage area on a one-to-one basis, and stores a discriminative data indicating a writing state of data into the data storage area,
wherein the control circuit decides a data storage area that will be a storage destination of the user data based on a relative difference relation of the discriminative data of respective memory blocks, and changes the discriminative data of the discrimination area corresponding to the data storage area in which the user data was written to a value different from that before the writing,
wherein the discriminative data includes a first state where one memory cell of the pair of memory cells is set to an erased state and another memory cell of the pair of memory cells is set to a writing state, and a second state where one memory cell of the pair of memory cells is set to a writing state and another memory the pair of memory cells is set to an erased state,
wherein the transition from the first state to the second state occurs by performing, in the first state, writing on another memory cell that is in the erased state without writing on one memory cell that is in the writing state, and
wherein a written threshold voltage value of one memory cell is more than a written threshold voltage value of another memory cell.

2. The nonvolatile memory according to claim 1,
wherein, if a different value is included in each of the discriminative data, then the control circuit decides the data storage area in which the user data will be written based on a boundary position of the different value in an arrangement order of the memory blocks.

3. The nonvolatile memory according to claim 1,
wherein, when writing the user data in the data storage area, the control circuit first initializes the data storage area and the discrimination area corresponding thereto, subsequently stores a user data in the data storage area, and subsequently changes the discriminative data stored in the discrimination area before initialization, to a different value.

4. The nonvolatile memory according to claim 1, wherein a voltage value of a cell decreases with time.

5. A method of controlling a nonvolatile memory,
the nonvolatile memory comprising:
a plurality of data memory sectors each including a plurality of memory blocks, the memory block including a data storage area for storing a user data and a discrimination area that is provided so as to correspond to the data storage area on a one-to-one basis, and stores a discriminative data indicating a writing state to the data storage area the memory block including a pair of memory cells as a complementary type so that one bit data is stored by setting an electric potential difference of the pair of the memory cells,
the method comprising:
deciding the data storage area that will be a storage destination of the user data based on a relative difference relation of the discriminative data of respective memory blocks; and
converting the discriminative data of the discrimination area that corresponds to the data storage area to which the user data has been written to a value different from that before the writing,
wherein the discriminative data includes a first state where one memory cell of the pair of memory cells is set to art erased state and another memory cell of the pair of memory cells is set to a writing state, and a second state where one memory cell of the pair of memory cells is set to a writing state and another memory cell of the pair of memory cells is set to an erased state, and
wherein the transition from the first state to the second state occurs by performing writing on another memory cell that is in the erased state in the first state.

6. The method according to claim 5, further comprising: if a different value is included in each of the discriminative data, deciding the data storage area in which the user data will be written based on a boundary position of the different value in an arrangement order of the memory blocks.

7. The method according to claim 5, further comprising:
initializing the data storage area and the discrimination area corresponding thereto when writing the user data in the data storage area;

storing the user data in the data storage area; and changing the discriminative data stored in the discrimination area to a different value before the initializing.

8. A method of controlling a nonvolatile memory, the nonvolatile memory comprising:

a data memory sector including:

a first memory block containing a first data storage area and a first discrimination area;

a second memory block containing a second data storage area and a second discrimination area; and a third memory block containing a third data storage area and a third discrimination area, each of the first to third memory blocks including a pair of memory cells in which are written one bit data by setting an electric potential difference in the pair of the memory cells;

the method comprising:

setting a first data into the first data storage area and a first state into the first discrimination area;

setting a second data into the second data storage area and the first state into the second discrimination area;

setting a third data into the third data storage area and the first state into the third discrimination area; and setting a fourth data into the first data storage area and a second state different from the first state into the first discrimination area, wherein the data in the discrimination areas are a discriminative data, and wherein the discriminative data includes the first state where one memory cell of the pair of memory cells is set to an erased state and another memory cell of the pair of memory cells is set to a writing state, and the second state where one memory cell of the pair of memory cells is set to a writing state and another memory cell of the pair of memory cells is set to an erase state, and wherein the transition from the first state to the second state occurs by performing writing on another memory cell that is in the erased state in the first state.

9. The method as claimed in claim 8, further comprising: before setting the first to fourth data, initializing the first to third data storage areas and the first to third discrimination areas, respectively.

10. The method as claimed in claim 8, further comprising:

in reading, when the first to third discrimination areas are set to the first state, or when the first to third discrimination areas are set to the second state, reading out the third data in the third data storage area; and when the first to third discrimination areas are not set to the first state, and when the first to third discrimination areas are not set to the second state, comparing a state in the first discrimination area to a state in the second discrimination area.

11. The method as claimed in claim 8, wherein the first data is set by writing "0" into one of the pair of memory cells and the first state is set to "0" so that the pair of memory cells can be read out as a data "0"; and wherein the second data is set by writing "0" into an other of the pair of memory cells and the second state is set to "void" so that the pair of memory cells can be read out as a data "1".

* * * * *